United States Patent
Gallo (10) Patent No.: US 11,735,938 B2
(45) Date of Patent: Aug. 22, 2023

(54) POWER ASSEMBLY AND METHODS THEREOF

(71) Applicant: Alberto Gallo, Rio Rico, AZ (US)

(72) Inventor: Alberto Gallo, Rio Rico, AZ (US)

( * ) Notice: Subject to any disclaimer, the term of this patent is extended or adjusted under 35 U.S.C. 154(b) by 79 days.

(21) Appl. No.: 17/175,997

(22) Filed: Feb. 15, 2021

(65) Prior Publication Data

US 2022/0263331 A1 Aug. 18, 2022

(51) Int. Cl.
*H02J 7/00* (2006.01)
*H02J 7/35* (2006.01)
*H05B 45/38* (2020.01)
*H02S 20/23* (2014.01)
*H01R 13/70* (2006.01)
*H01R 13/717* (2006.01)
*H01R 27/02* (2006.01)
*H05K 5/02* (2006.01)

(52) U.S. Cl.
CPC .......... *H02J 7/0068* (2013.01); *H01R 13/701* (2013.01); *H01R 13/717* (2013.01); *H01R 27/02* (2013.01); *H02J 7/0042* (2013.01); *H02J 7/0048* (2020.01); *H02J 7/35* (2013.01); *H02S 20/23* (2014.12); *H05B 45/38* (2020.01); *H05K 5/0217* (2013.01)

(58) Field of Classification Search
CPC .... H05K 5/0217; H02J 7/0048; H02J 7/0068; H02J 7/35; H02J 7/0042; H02S 20/23; H01R 13/701; H01R 27/02; H01R 13/717; H05B 45/38
See application file for complete search history.

(56) References Cited

U.S. PATENT DOCUMENTS

| 2013/0320919 | A1* | 12/2013 | Adames | H02J 7/0013 320/107 |
| 2015/0145433 | A1* | 5/2015 | Hiramatu | H05B 45/385 315/291 |
| 2018/0316201 | A1* | 11/2018 | Miller | H02J 7/0042 |
| 2019/0157894 | A1* | 5/2019 | Shalaby | G06F 1/206 |

FOREIGN PATENT DOCUMENTS

CN 2038245 U * 5/1989 ............. G01R 31/00

\* cited by examiner

*Primary Examiner* — Jared Fureman
*Assistant Examiner* — Duc M Pham
(74) *Attorney, Agent, or Firm* — Polsinelli PC (57) ABSTRACT

A power assembly module provides multiple interfaces for accessing a battery. A power input of the power assembly module can receive power from a variety of external sources. Photovoltaic panels, car batteries, or any other suitable DC power source can be used to charge the battery within the power assembly module. A switch provided on a housing of the module allows for activation or deactivation of power delivery from the battery, at outputs of the power assembly module. In some embodiments, the power assembly module includes a single power output that provides power from the battery using a cabled connector. Additionally, the power assembly module includes a power distribution element that provides power from a standard plug outlet for powering certain appliances that receive power using a standardized electric plug terminal.

20 Claims, 9 Drawing Sheets

POWER ASSEMBLY AND METHODS THEREOF

FIELD

The present disclosure generally relates to the various fields associated with electrical devices; and in particular, to a power assembly for providing power to any electrical device outside of a normal power grid.

BACKGROUND

With recent advancements in computer miniaturization, embedded systems have found applications in various home systems. As an example, many homes are equipped with electronic devices for tracking the health and power consumption of electric appliances within a home, as well as the temperature cycles of a home's interior space. Such smart devices for home system monitoring, though replete in utility, fail to address challenges faced by consumers who live in rural or off-grid environments. Off-grid and minimally developed geographic regions have residential and business opportunities, but may not always have constant or reliable access to central power systems similar to larger urban cities.

Residents and employees who live and work in such settings, therefore, have to contend with challenges that are not addressed by smart devices and are often more fundamental in nature. In some localities or off-grid environments, widespread power generation and transmission may be totally unavailable, or unreliable to the point that the only viable energy sources by which electric energy can be harvested to power electronics are batteries (e.g., non-rechargeable batteries such as a vehicle battery, rechargeable batteries) or sunlight.

It is with these observations in mind, among others, that various aspects of the present disclosure were conceived and developed.

Corresponding reference characters indicate corresponding elements among the view of the drawings. The headings used in the figures do not limit the scope of the claims.

DETAILED DESCRIPTION

Aspects of the present disclosure relate to power assemblies that provide multiple charge paths and multiple output discharge paths by which electric devices can be powered.

According to one or more aspects of the disclosure, a power assembly receives and stores power for on-demand use. A module within the power assembly includes a switch for activating power delivery to one or more power outputs of the power assembly. The module housing also includes a display that indicates the battery charge level based on a measured voltage level of the battery.

Within the power assembly module, a battery management system receives power from an input terminal, and manages the charging and power delivery of a battery pack. The battery management system protects the battery pack from overcharging, over-discharging, and excessive current. When the switch for activating power delivery is disengaged, the battery management system and the battery are electrically disconnected from one or more output terminals of the power assembly module.

When the switch for activating power delivery is engaged, the battery management system is connected to at least one output terminal of the power assembly module. One of the output terminals of the power assembly module can include a distribution element that couples with a standardized AC electric plug. As an example, the distribution element can couple to a NEMA connector for devices that ordinarily operate on AC utility power sources (e.g., AC mains electricity sources). The power assembly module can include additional distribution elements that provide different output voltages.

Various embodiments of the disclosure are discussed in detail below. While specific implementations are discussed, it should be understood that this is done for illustration purposes only. A person skilled in the relevant art will recognize that other components and configurations may be used without parting from the spirit and scope of the disclosure.

As disclosed herein, the various systems, devices, and processes are described in the context of a "home." As used herein, the terms "home," "house," and/or "building" are used interchangeably and generally refer to a physical structure on a property, including residential homes and commercial buildings. Similarly, "home power sources" can refer to "AC mains electricity" power sources, "grid electricity" power sources, or "utility" power sources. However, it should be understood and appreciated that the power assembly and associated components described herein may be implemented within any vehicle or other environment having input and output components for power delivery.

Figure 1A:
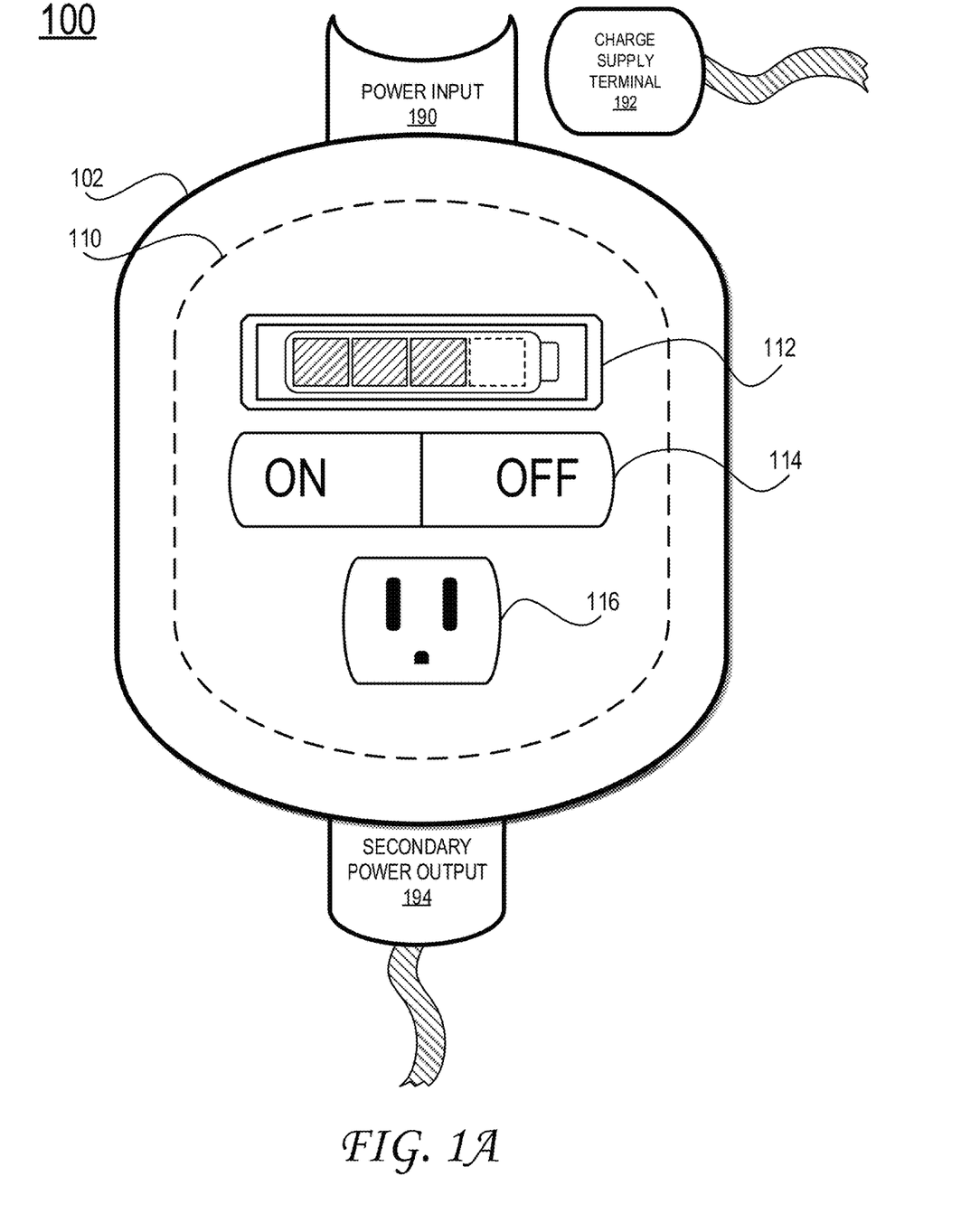
FIG. 1A illustrates a schematic diagram of an example power assembly module with two power outputs.

Referring to the figures, FIG. 1A illustrates a schematic diagram of one embodiment of a power assembly module 100. Power assembly module 100 includes a housing 102. Housing 102 can be a plastic housing, or can be formed from a mixture of plastic and metal components. In some embodiments, housing 102 is an off-the-shelf housing component that is adapted for mounting within a cavity of a building structure or electrical outlet receptacle box.

An interface region 110 is located on a front face of housing 102. Interface region 110 includes a display 112 that graphically indicates a charge level of a battery pack located within housing 102. Display 112 can render a battery graphic with four bars or grids, indicating charge level of the battery pack. In some embodiments, display 112 illuminates a single bar/grid of the battery graphic when the voltage level of the battery pack is greater than a first threshold voltage level. In such embodiments, display 112 illuminates two bars/grids of the battery graphic when the voltage level of the battery pack is greater than a second threshold voltage level higher than the first threshold voltage level, illuminates three bars/grids of the battery graphic (as pictured in FIG. 1A) when the voltage level of the battery pack is greater than a third threshold voltage level greater than the second threshold voltage level, and illuminates four bars/grids of the battery graphic when the voltage level of the battery pack is greater than a fourth threshold voltage level greater than the third threshold voltage level.

Interface region 110 also includes a switch 114 that has an "ON" or activated/engaged position, and an "OFF" or deactivated/disengaged position. Switch 114 is a double pole single throw switch that electrically disconnects a battery (and its battery management system) from the output terminals or power distribution elements of power assembly module 100, when disengaged in the "OFF" position. When engaged in the "ON" position, switch 114 electrically connects the battery and its battery management system to the output terminals or power distribution elements of power assembly module 100.

Interface region 110 also includes a power distribution element 116 that serves as the primary power output of power assembly module 100. Power distribution element 116 can be a female NEMA plug adapter that can couple to male NEMA plugs that are either grounded (3-prong plug) or ungrounded (2-prong plug) connectors. Power assembly module 100 delivers a first DC output voltage to output terminals within power distribution element 116.

In some embodiments, power assembly module 100 further includes at least one secondary power output 194 that delivers a second DC output voltage to its output terminals. As an example, secondary power output 194 can be terminated with a USB, mini-USB, or micro-USB plug that delivers power to portable electronic devices. In some embodiments, the second DC output voltage provided to terminals of secondary power output 194 is greater than the first DC output voltage provided at terminals of power distribution element 116.

Power assembly module 100 also includes a power input 190 for charging the battery, using its battery management system. Power input 190 couples to a charge supply terminal 192 that can deliver power to the battery within power assembly module 100, regardless of the state or position of switch 114. Charge supply terminal 192 can belong to a number of different power sources. As an example, charge supply terminal 192 can belong to a photovoltaic panel (e.g., a solar panel) that outputs charge in response to receiving incident light or sunlight. Charge supply terminal 192 can also belong to a vehicle power supply adapter (e.g., a cigarette lighter adapter) that connects to a car battery power supply. Charge supply terminal 192 can also belong to a USB wall terminal that converts AC mains electricity or utility power to a DC voltage. In general, charge supply terminal 192 can belong to any charging source capable of delivering power to terminals of power input 190 of power assembly module 100.

In some embodiments, charge supply terminal 192 is a female USB connector, and power input 190 is a male USB connector. Conversely, in some embodiments, charge supply terminal 192 is a male USB connector and power input 190 is a female USB connector.

Figure 1B:
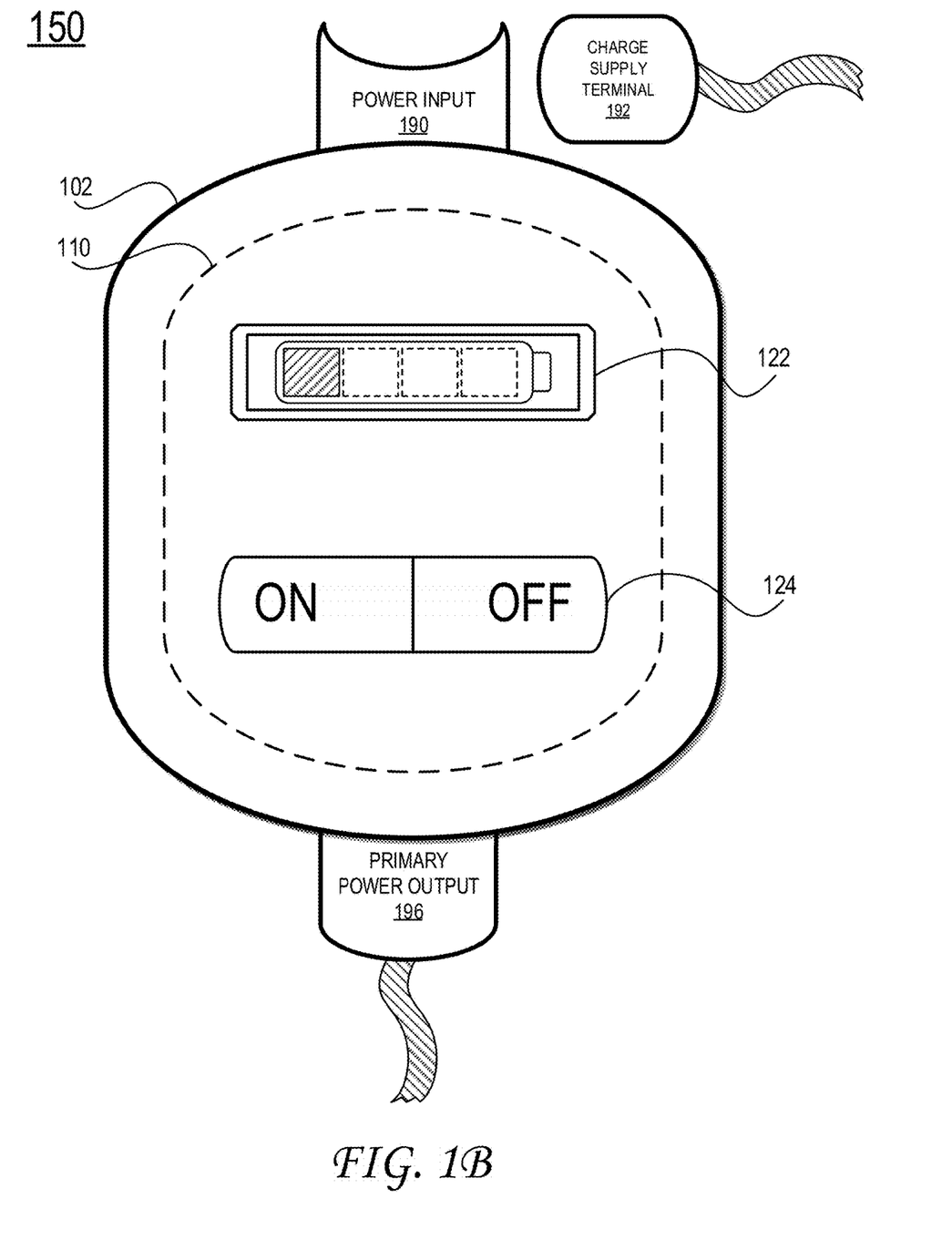
FIG. 1B illustrates a schematic diagram of an example power assembly module with a single power output.

FIG. 1B illustrates a schematic diagram of power assembly module 150. In contrast with power assembly module 100 of FIG. 1A, module 150 does not include power distribution element 116 and instead uses primary power output 196 as the sole output for power delivery from a battery pack contained in housing 102. Housing 102, as described above in connection with FIG. 1A, can be a plastic housing, or can be formed from a mixture of plastic and metal components. In some embodiments, housing 102 is an off-the-shelf housing component that is adapted for mounting within a cavity of a building structure or electrical outlet receptacle box.

Module 150 of FIG. 1B also includes an interface region 110 on a front face of housing 102. Interface region 110 or module 150 includes a display 122 that graphically indicates a charge level of a battery pack located within housing 102. Display 122 can render a battery graphic with four bars or grids, indicating charge level of the battery pack. In some embodiments, display 122 illuminates a single bar/grid of the battery graphic when the voltage level of the battery pack is greater than a first threshold voltage level (as pictured in FIG. 1B). In such embodiments, display 122 illuminates two bars/grids of the battery graphic when the voltage level of the battery pack is greater than a second threshold voltage level higher than the first threshold voltage level, illuminates three bars/grids of the battery graphic when the voltage level of the battery pack is greater than a third threshold voltage level greater than the second threshold voltage level, and illuminates four bars/grids of the battery graphic when the voltage level of the battery pack is greater than a fourth threshold voltage level greater than the third threshold voltage level.

Interface region 110 also includes a switch 124 that has an "ON" or activated/engaged position, and an "OFF" or deactivated/disengaged position. Switch 124 is a double pole single throw switch that electrically disconnects a battery (and its battery management system) from the output terminals or power distribution elements of power assembly module 100, when disengaged in the "OFF" position. When engaged in the "ON" position, switch 124 electrically connects the battery and its battery management system to circuitry within module 100 that causes an output voltage to be produced at output terminals of primary power output 196.

As an example, primary power output 196 can be terminated with a USB, mini-USB, or micro-USB plug that delivers power to portable electronic devices. In some embodiments, the second DC output voltage provided to terminals of secondary power output 196 is greater than the output voltage provided by the battery of power assembly module 150.

Power assembly module 150 also includes a power input 190 for charging the battery, using its battery management system. Power input 190 couples to a charge supply terminal 192 that can deliver power to the battery within power assembly module 100, regardless of the state or position of switch 114. Charge supply terminal 192 can belong to a number of different power sources. As an example, charge supply terminal 192 can belong to a photovoltaic panel (e.g., a solar panel) that outputs charge in response to receiving incident light or sunlight. Charge supply terminal 192 can also belong to a vehicle power supply adapter (e.g., a cigarette lighter adapter) that connects to a car battery power supply. Charge supply terminal 192 can also belong to a USB wall terminal that converts AC mains electricity or utility power to a DC voltage. In general, charge supply terminal 192 can belong to any charging source capable of delivering power to terminals of power input 190 of power assembly module 150.

In some embodiments, charge supply terminal 192 is a female USB connector, and power input 190 is a male USB connector. Conversely, in some embodiments, charge supply terminal 192 is a male USB connector and power input 190 is a female USB connector.

Figure 1C:
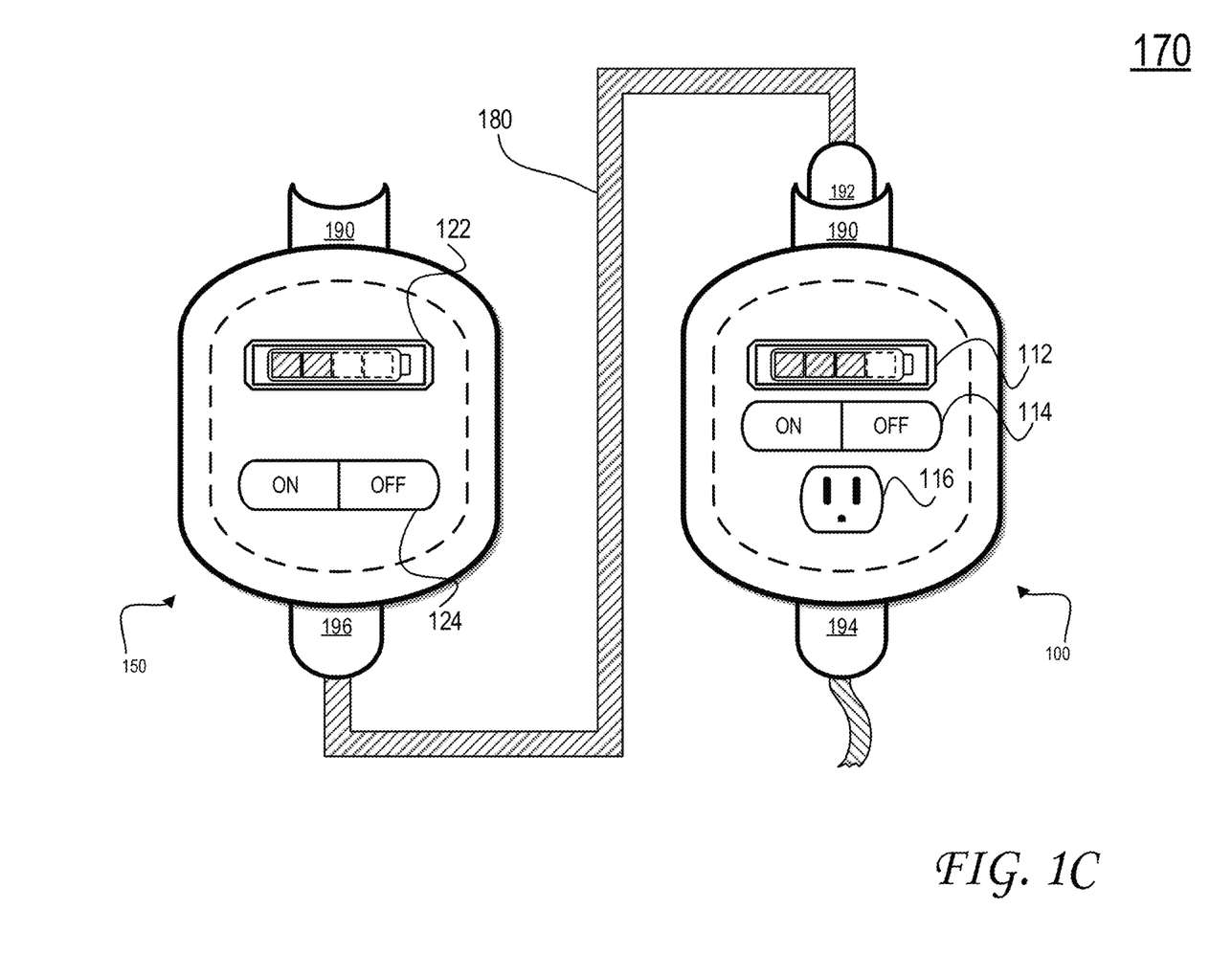
FIG. 1C illustrates a diagram of an example configuration of the power assembly module of FIG. 1B connected in series to the power assembly module of FIG. 1A.

FIG. 1C illustrates a diagram of configuration 170, where power assembly module 150 of FIG. 1B is connected in series to power assembly module 100 of FIG. 1C. At a high level, configuration 170 illustrates how a power stored within a first battery of module 150 can be distributed to module 100. To aid in the identification of modules 100 and 150, module 100 may sometimes be referred to as a "dual output power assembly module," and module 150 may sometimes be referred to as a "single output power assembly module." As shown by configuration 170, primary power output 196 of module 150 provides an output path via a connecting cable 180 that terminates with a charge supply terminal 192 (e.g., a male USB connector).

Power input 190 of dual output power module 100 receives charge supply terminal 192 from single output power module 150. When switch 124 of single output power assembly module 150 is activated or engaged in the "ON" position, power from a battery pack within module 150 is output via primary power output 196. Power from the battery pack within module 150 is subsequently conveyed over connecting cable 180 to module 100. Connecting cable 180 terminates with charge supply terminal 192, which is connected or otherwise coupled with power input 190 of module 100. Power output via primary power output 196 may be at an output voltage that is greater than or equal to the nominal voltage level of the battery pack. Importantly, the output voltage of power provided via primary power output 196 should be substantially equal to a charging voltage associated with the battery within module 100.

When switch 124 of single output power assembly module 150 is disengaged or deactivated in the "OFF" position, power delivery via primary power output 196 is halted.

At dual output power assembly module 100, the output power from single output power assembly module 150 is received at power input 190 and used to charge a battery within module 100. FIG. 1O shows configuration 170, where single output power assembly module 150 is used to charge a battery within dual output power assembly module 100. However, in other configurations, dual output power assembly module 100 can be used to charge a battery within single output power assembly module 150. In another configuration, a dual output power assembly module 100 can be used to charge a battery within another dual output power assembly module 100. In yet another configuration, a single output power assembly module 150 can be used to charge a battery within another single output power assembly module 150.

Figure 2:
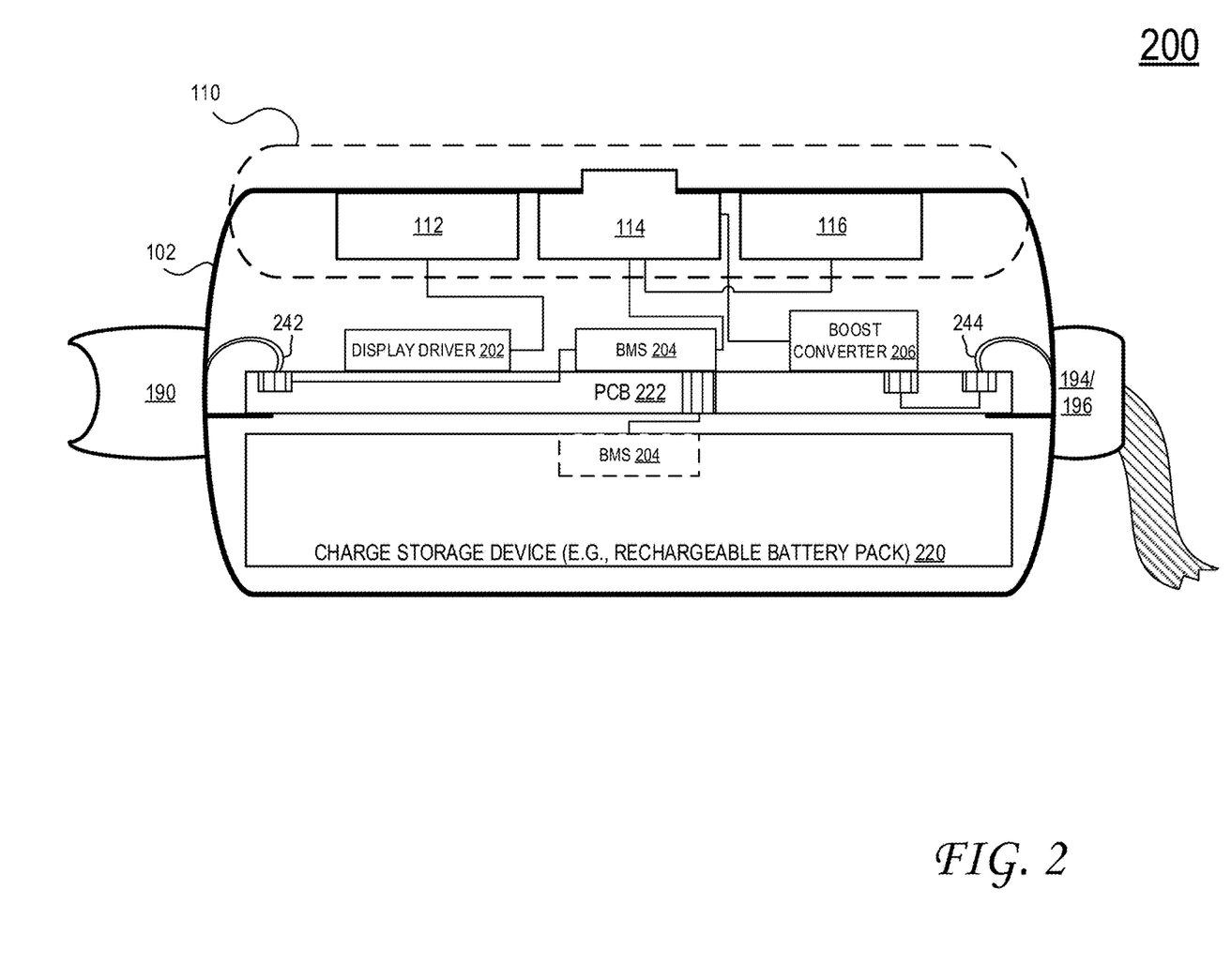
FIG. 2 illustrates a cross-sectional side view of the power assembly module of FIG. 1A, specifically detailing the internal components.

FIG. 2 illustrates a cross-sectional side view 200 of the power assembly module 100 of FIG. 1A, specifically detailing the internal components. With reference to interface region 110, display 112 is coupled to a display driver 202. Display driver 202 can include a microcontroller, or application-specific display driving circuitry capable of driving and adjusting display 112. In some embodiments, display driver 202 receives an input specifying a voltage level corresponding to the charge level of a charge storage device 220 (e.g., a rechargeable battery pack). Based on the input voltage level corresponding to the charge level of charge storage device 220, display driver 202 selectively illuminates bars/grids of the battery graphic illustrated in FIGS. 1A-1C.

In some embodiments, charge storage device 220 is a lithium ion battery pack that has an output voltage in the range of 3.7 to 4.2 Volts. Display driver 202 can receive an input specifying the current output voltage of charge storage device 220 and cause display 112 to show/output a battery graphic with a single illuminated battery bar when the voltage output by charge storage device 220 is between 3.3 and 3.5 Volts. Display driver 202 may cause display 112 to show/output a battery graphic with two illuminated battery bars when the voltage output by charge storage device 220 is between 3.5 and 3.7 Volts. Display driver 202 may cause display 112 to show/output a battery graphic with three illuminated battery bars when the voltage output by charge storage device 220 is between 3.7 and 3.9 Volts. Display driver 202 may cause display 112 to show/output a battery graphic with four illuminated battery bars when the voltage output by charge storage device 220 is greater than 3.9 Volts.

Charge storage device 220 can include any number of rechargeable battery packs. When charge storage device 220 includes multiple identical rechargeable battery packs connected in series, the battery packs can produce a boosted output voltage level that is greater than the output of an individual battery pack. When charge storage device 220 includes multiple identical rechargeable battery packs connected in parallel, the battery packs can produce the same voltage as a single rechargeable battery pack, at a higher current or capacity rating. As an example, a single battery pack of charge storage device 220 may produce a 4.2 Volt output level and have 11.5 Ah (amp-hours) of capacity. If two such battery packs are wired in series, the resultant charge storage device may produce an 8.4 Volt output level (two times the single-pack output voltage of 4.2 Volts) with 11.5 Ah of capacity at the same current rating as the single battery pack. If two such battery packs are wired in parallel, the resultant charge storage device may produce a 4.2 Volt output level with 23 Ah or capacity (two times the single-pack capacity of 11.5 Ah) at double the current rating as the single battery pack.

Charge storage device 220 is at least one rechargeable charge storage device, such as a collection of lithium ion (Li-ion) rechargeable battery cells. Charge storage device 220 can include collections of rechargeable battery cells that receive charge from input power sources, and deliver power to output power sinks or loads.

A printed circuit board (PCB) 222 is mounted or otherwise secured to and/or positioned along an inner sidewall of housing 102, between charge storage device 220 and display 112, switch 114, and distribution element 116 of interface region 110. In some embodiments, PCB 222 is mounted below charge storage device 220, at an opposing end of housing 102 relative to interface region 110. PCB 222 receives a number of power input connections at input terminal wires 242, which electrically couple the input terminals of power input 190 to PCB 222. Input terminal wires 242 contain ground connections that electrically connect corresponding ground terminal wires in charge supply terminal 192 to PCB 222. Input terminal wires 242 further contain supply voltage connections that electrically connect corresponding supply voltage wires to PCB 222. Input terminal wires 242 connect to one or more contact pads on PCB 222, which route the electrical currents to a battery management system 204. In some embodiments, PCB 222 may be excluded from power assembly module 100, and the components mounted thereon can be interconnected through wired connectors rather than metallic/conductive traces formed on or within PCB 222.

Battery management system 204 is shown in FIG. 2 as having two possible placements. A first placement of battery management system 204 is mounted on an upper surface of PCB 222. In such arrangements, battery management system 204 can include any discrete semiconductor component, microcontroller, or application-specific integrated circuit (ASIC) that is capable of performing battery management for the rechargeable battery cells of charge storage device 220. Alternatively, battery management system 204 is integrated into the charge storage device 220 as a separate management component that is associated with the collection of rechargeable battery cells. For simplicity, it will be assumed that battery management system 204 is mounted on PCB 222.

Battery management system 204 connects to switch 114 using wires for supply voltage and ground connections associated with the battery output supply voltage and ground terminals. Switch 114 is in turn connected to distribution element 116 and boost converter 206. Boost converter 206 has output terminals that are electrically connected to output terminal wires 244 connected to one or more contact pads on PCB 222, which carry the electrical currents from boost converter 206. Output terminal wires 244 electrically connect to secondary power output 194. Output terminal wires 244 contain ground connections that electrically connect corresponding ground terminal wires in secondary power output 194 to PCB 222 (namely, the ground output of boost converter 206). Input terminal wires 242 further contain supply voltage connections that electrically connect corresponding supply voltage wires to PCB 222 (namely, the boosted voltage output of boost converter 206).

When switch 114 is engaged, battery management system 204 is connected to boost converter 206 and power distribution element 116. A battery voltage level may be output across terminals of power distribution element 116 when switch 114 is engaged. A boosted voltage level may be output across terminals of secondary power output 194 when switch 114 is engaged. When switch 114 is disengaged, battery management system 204 is electrically disconnected from power distribution element 116 and boost converter 206.

Figure 3:
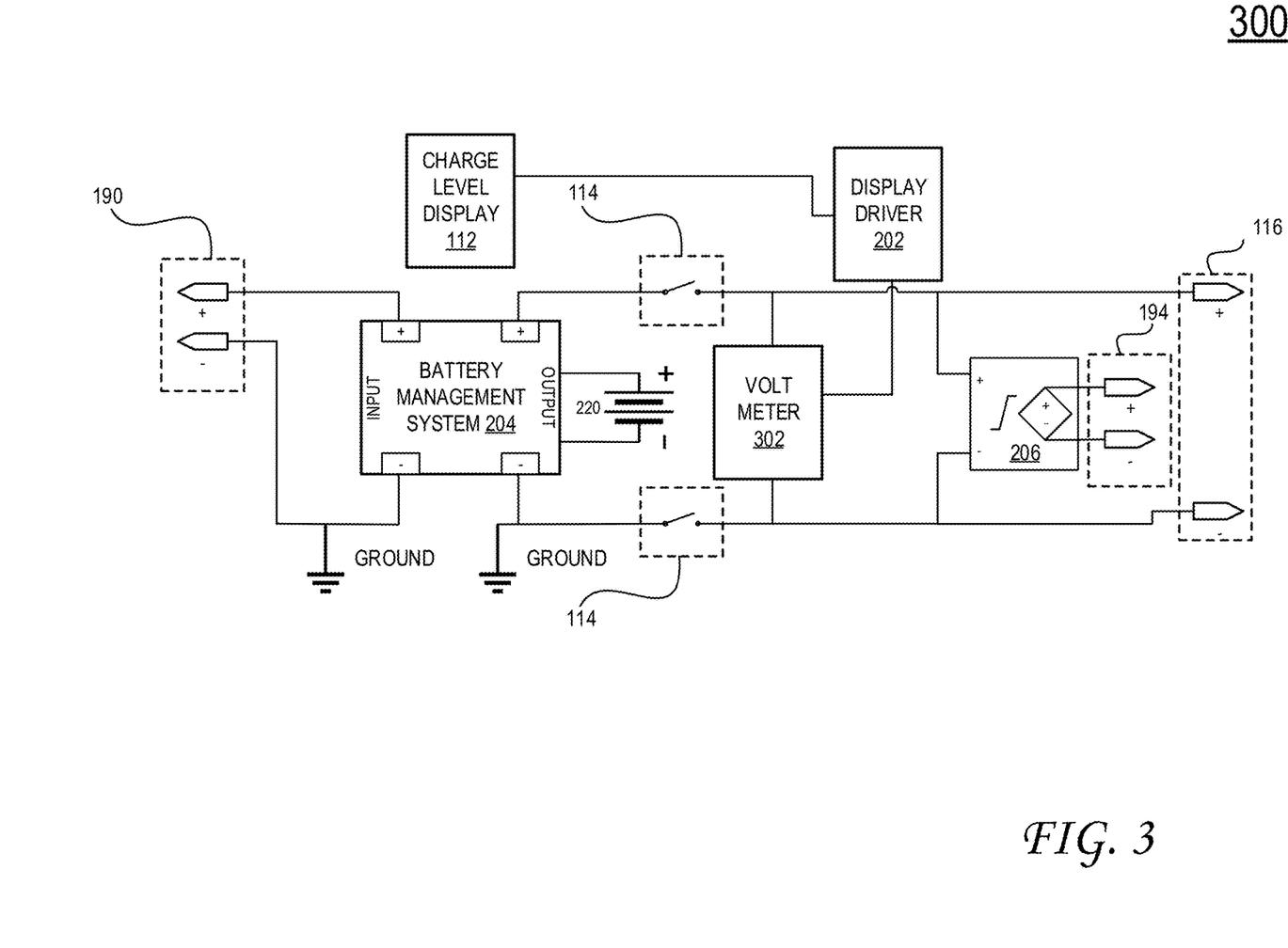
FIG. 3 illustrates a circuit diagram of charging and display circuits using the components illustrated in the cross-sectional side view of FIG. 2.

FIG. 3 illustrates a circuit diagram of the charging and display circuit components shown in the cross-sectional side view of FIG. 2. Circuit 300 may be formed from metal traces and components mounted on or to PCB 222. Starting from the left of the circuit 300, positive and negative terminals of power input 190 are illustrated. As described above in connection to FIG. 2, the electrical connection between the source supply voltage lines and ground supply voltage lines of power input 190 and PCB 222 is facilitated by input terminal wires 242.

Battery management system 204 has an input port and an output port, each with corresponding positive and negative terminals. Battery management system 204 implements an overcharge release voltage threshold, and thereby prevents or reduces charging voltages exceeding a level that is not well tolerated by the rechargeable battery cells of charge storage device 220. In embodiments where charge storage device 220 is a 3.7 to 4.2 Volt Li-Ion battery, the overcharge release voltage threshold may be 4.23 to 4.25 Volts. Battery management system 204 also implements an over-discharge voltage threshold that prevents discharge of the battery to voltage levels below a level that is not well tolerated by the rechargeable battery cells of charge storage device 220. In embodiments where charge storage device 220 is a 3.7 to 4.2 Volt Li-Ion battery, the over-discharge release voltage threshold may be 2.44 Volts.

Battery management system 204 also implements an over-current amperage threshold that prevents excessive current draw from the rechargeable battery cells of charge storage device 220 (current draws in excess of safe-operation ratings of device 220). In embodiments where charge storage device 220 is a 3.7 to 4.2 Volt Li-Ion battery, the over-current amperage threshold may be between 1 and 3 Amperes.

Battery management system 204 manages charging of charge storage device 220 using the aforementioned overcharge, over-discharge, and over-current protections. Charges from power input 190 and charge supply terminal 192 of a charging source are received at an input port of battery management system 204. As charges from power input 190 and charge supply terminal 192 are received at battery management system 204, charge storage device 220 is charged. At an output port of battery management system 204, a positive supply voltage output port and a ground voltage output port are connected to two respective input poles of switch 114, which is a double-pole single-throw switching element. In embodiments where switch 114 is a single-pole single-throw switching element, only the positive supply voltage output port of battery management system 204 may be coupled to an input pole of switch 114.

When switch 114 is disengaged (as illustrated in FIG. 2), the output port of battery management system 204 is electrically disconnected from the remainder of circuit 300. When engaged, switch 114 connects the output port of battery management system 204 to the remainder of circuit 300. The output port voltage level of battery management system 204 is measured by a volt meter 302 that outputs a signal based on the voltage level of the output port of system 204, which outputs the voltage level of charge storage device 220. In some embodiments volt meter 302 outputs a digital signal indicating the voltage level of the output port of battery management system 204 measured by volt meter 302 (e.g., a digital voltage measurement value). In other embodiments, volt meter 302 outputs an analog signal indicating the voltage level of the output port of battery management system 204 measured by volt meter 302 (e.g., an analog voltage measurement value).

Volt meter 302 provides a measured output value to display driver 202 (e.g., driver 202 receives an analog or digital signal representing the voltage level of charge storage device 220 produced at the output of battery management system 204). Display driver 202 interprets the output value from volt meter 302 and determines a corresponding display graphic to display on charge level display 112. As described above in connection with FIG. 2, display driver 202 can receive an input specifying the current output voltage of charge storage device 220 and cause display 112 to show/output a battery graphic with one to four illuminated bars, based on the charge level of device 220. However, display driver 202 can alternatively output a numerical percentage value corresponding to an estimated percentage of battery life or charge remaining in charge storage device 220. In embodiments where display driver 202 is adapted to display a graphical battery with illuminated bars corresponding to charge levels, the battery graphic may flash or change color (e.g., from green to red) in response to the output voltage level of charge storage device 220 output by battery management system 204 falling below a particular threshold voltage level.

Output terminals of battery management system 204 are also connected to supply and ground terminals of power distribution element 116. The output terminals of system 204 provide regulated voltage and current from charge storage device 220, when switch 114 is engaged in the "ON" position. A power output of module 100 is a connector or connection to the regulated voltage and current outputs provided by battery management system 204, and can be routed to multiple output or delivery elements. As described above in connection with FIG. 1A, power distribution element 116 can serve as the primary power output of power assembly module 100. Power distribution element 116 can be a female NEMA plug adapter that can couple to male NEMA plugs that are either grounded (3-prong plug) or ungrounded (2-prong plug) connectors.

In this way, terminals of power distribution element 116 supply a voltage level corresponding to the voltage level of charge storage device 220, managed by battery management system 204. If, for example, a load device connected at power distribution element 116 draws an amount of current that exceeds an over-current threshold (e.g., a load that draws 3 Amperes when the over-current threshold is 2 Amperes), battery management system 204 may halt delivery of power to the load by internally disconnecting charge storage device 220 from its output terminals. Similarly, if a load device connected at power distribution element 116 discharges charge storage device 220 below an over-discharge threshold voltage level, battery management system 204 may halt delivery of power to the load by internally disconnecting charge storage device 220 from its output terminals.

When switch 114 is engaged in the "ON" connection, battery management system 204 additionally provides regulated voltage and current from charge storage device 220 to input terminals of boost converter 206. Boost converter 206 is a power converter that produces an increased, or stepped-up voltage at its output terminals. Boost converter 206 is a DC-to-DC power converter that can be formed using interconnections between discrete components laid out on PCB 222. Boost converter 206 includes any combination of electrical components such as voltage terminals, resistors, inductors, capacitors, and switching components. These components within boost converter 206 are interconnected using metallic/conductive traces provided on PCB 222. The components of boost converter 206 themselves may be discrete through-hole components, or discrete surface-mount components that are interconnected using metallic traces provided on PCB 222.

At its input port, boost converter 206 receives an input supply voltage and a ground voltage the output stage of battery management system 204. By operation of the components of boost converter 206, a boosted output voltage (e.g., an output voltage that is greater than the input supply voltage) is provided across an output port 194 of boost converter 206. As labeled in FIG. 1, output port 194 may be a "secondary power output." However, it should be understood that output port 194 may function as the primary power output of power assembly module 100 in certain embodiments or arrangements during operation (e.g., when no load device is connected to power distribution element 116).

Figure 4A:
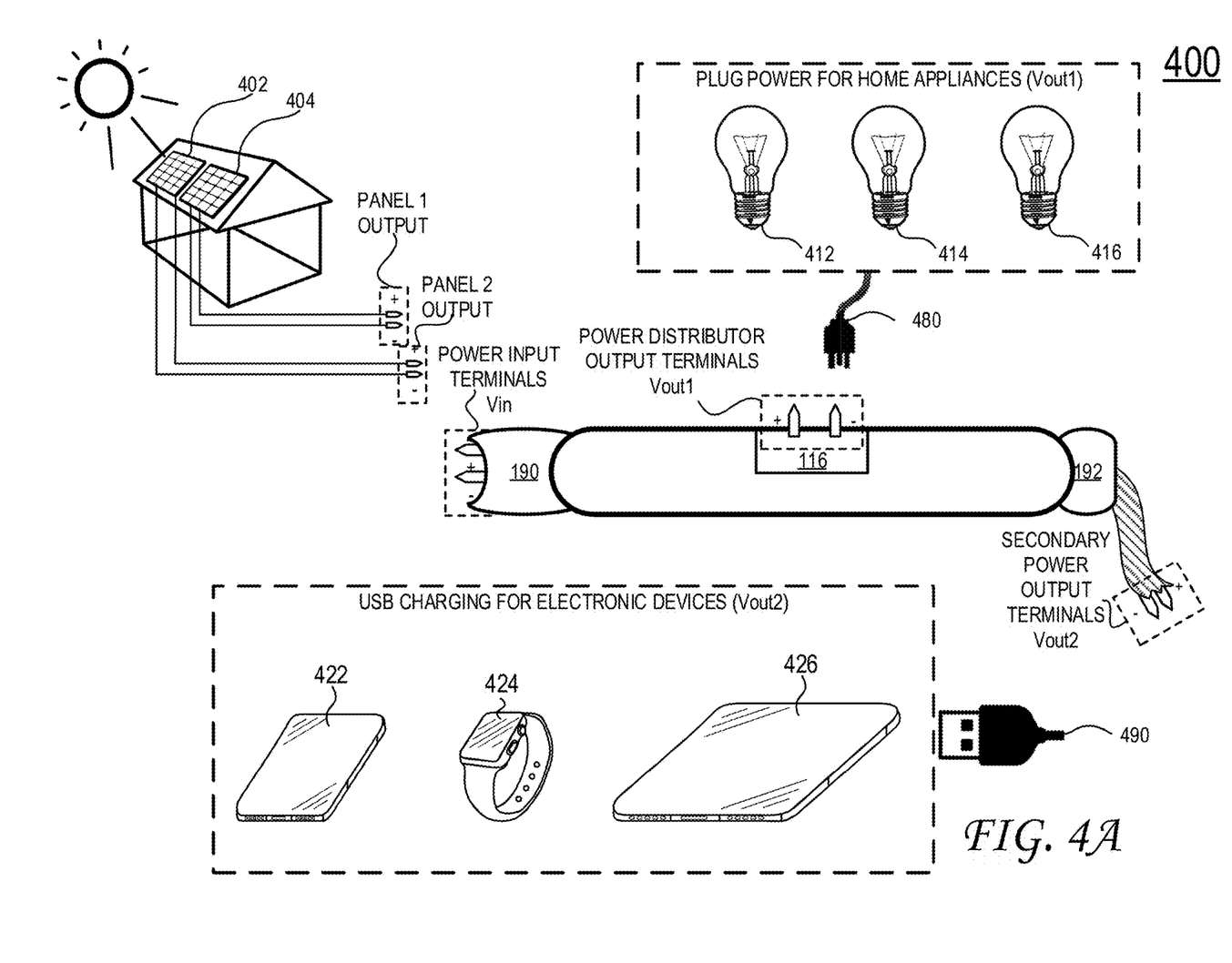
FIG. 4A illustrates a schematic block diagram of the power assembly module showing exemplary power sources and devices that can be powered by the power assembly.

In some embodiments, output port 194 provides secondary output terminals that provide a boosted voltage output to a male USB connector (illustrated by connector 490 in FIG. 4A). The boosted voltage provided at terminals of output port 194 is an increased voltage relative to the input supply voltage provided to the input stage of boost converter 206 (namely, the voltage from charge device 220 provided by battery management system 204). In embodiments where output port 194 includes a male USB connector, module 100 containing circuit 300 can provide charging capabilities to portable electronic devices that charge using 5 Volt supply voltages. The boosted 5 Volt output produced at the terminals of output port 194 may have a lower maximum current draw, compared to the non-boosted output at terminals of power distribution element 116. The non-boosted output at terminals of power distribution element 116 may be between 3.7 and 4.2 Volts, when charge storage device 220 is a single Li-Ion battery pack, or multiple parallel connected battery packs.

In some embodiments, a power assembly module, such as the module 150 of FIG. 1B, does not include power distribution element 116. In such embodiments, the primary output of module 150 is primary power output 196, which provides a boosted output voltage at a cable connector. Primary power output 196 can include a male USB connector or any suitable connector for delivering the output voltage produced by boost converter 206.

As described above, circuit 300 receives charge from terminals supply and ground terminals of power input 190, which is an input port for receiving charge supply terminal 192 from a power source. Power input 190 connects a positive supply voltage from charge supply terminal 192 to a corresponding positive input of battery management system 204, at an input port. Power input 190 also connects a ground supply voltage from charge supply terminal 192 to a corresponding negative or ground input of battery management system 204, at the input port. Battery management system also has an output port that is electrically connected to various loads when switch 114 is engaged in the "ON" position.

Output terminals of battery management system 204 provide regulated voltage and current from charge storage device 220. These output terminals are connected to volt meter 302, positive supply voltage and ground terminals of power distribution element 116, as well as supply voltage and ground input terminals of boost converter 206. Volt meter 302 produces an analog or a digital voltage reading which is then conveyed to display driver 202, which displays a charge level graphic on charge level display 112, corresponding to the charge level indicated by the output voltage of battery management system 204. Power distribution element 116, which can serve as the primary power output of power assembly module 100, is a female NEMA plug adapter that can couple to male NEMA plugs that are either grounded (3-prong plug) or ungrounded (2-prong plug) connectors in certain embodiments. Power distribution element 116 outputs a voltage level that is substantially equal to the output voltage level of charge storage device 220. Secondary power output terminals 194 connected to an output terminal of boost converter 206 output a boosted voltage level that is substantially greater than the output voltage level of charge storage device 220. Boost converter 206 may provide an adjustable level of boost to the voltage provided at its input port, or a fixed level of boost. In some embodiments, secondary power output terminals 194 terminate in a male USB connector terminal (pictured in FIG. 4A).

As described above in connection to FIG. 2, the electrical connection between the boosted supply voltage lines and ground supply voltage lines output by boost converter 206 and corresponding supply and voltage terminals of secondary power output 194 is facilitated by output terminal wires 244.

FIG. 4A illustrates a schematic block diagram of the power assembly 100 showing exemplary power sources such as photovoltaic panels 402 and 404, as well as exemplary devices 412, 414, 416, 422, 424, and 426 that can be powered by the power assembly. As shown in FIG. 4A, a home that receives incident sunlight on its roof has photovoltaic panels 402 and 404 that have respective output terminals. A first photovoltaic panel 402 has a first output labeled Panel 1 output, and a second photovoltaic panel 404 has a second output labeled Panel 2 output.

One or more outputs from photovoltaic panels 402 and 404 can be connected as the charge supply terminal 192 that couples to power input 190 of power assembly module 100. When a single output from panels 402 and 404 is used, the corresponding output from the panels (e.g., Panel 1 output or Panel 2 output) may be terminated with a charge supply terminal 192 connector. Power input 190 receives an input charge supply from panels 402 and/or 404 (e.g., Panel 1 output and/or Panel 2 output) and couples positive and ground supply voltage terminals of one or more of the panels to PCB 222 via input terminal wires 242 (illustrated in FIG. 2). In some embodiments, Panel 1 output and Panel 2 output from panels 402 and 404 may be connected in parallel and both provided in a single charge supply terminal 192 to power input 190. Power received at power input 190 terminals may be associated with a voltage level Vin (e.g., Panel 1 output and/or Panel 2 output supply a voltage level Vin).

Power distribution element 116 outputs a voltage Vout1 at its output terminals. Appliances such as exemplary light bulbs 412, 414, and 416 may connect to power distribution element 116 using a respective plug 480. As described above, power distribution element 116 can be a female NEMA plug adapter. Though plug 480 is illustrated as associated with exemplary home appliances such as light bulbs 412, 414, and 416, any home appliance that receives power through a male NEMA terminated plug can connect to power distribution element 116. Plug 480 is also illustrated as a three prong plug (grounded NEMA connector) but can also be a two prong plug (ungrounded NEMA connector).

Secondary power output produces a boosted voltage Vout2 at its output terminals. Devices such as smartphone 422, wearable electronic device 424, and tablet 426 connect to, and be charged by, the boosted voltage Vout2 received via connector 490 of secondary power output 192. As described above, secondary power output 192 can be a male USB plug adapter. Though plug 480 is illustrated as associated with exemplary electronic devices such as smartphone 422, wearable electronic device 424, and tablet 426, any electronic device that requires a boosted voltage Vout2 to charge can connect to secondary power output 192. Connector 490 is illustrated as a male USB-A plug but can alternatively be a mini-USB or micro-USB connector.

Figure 4B:
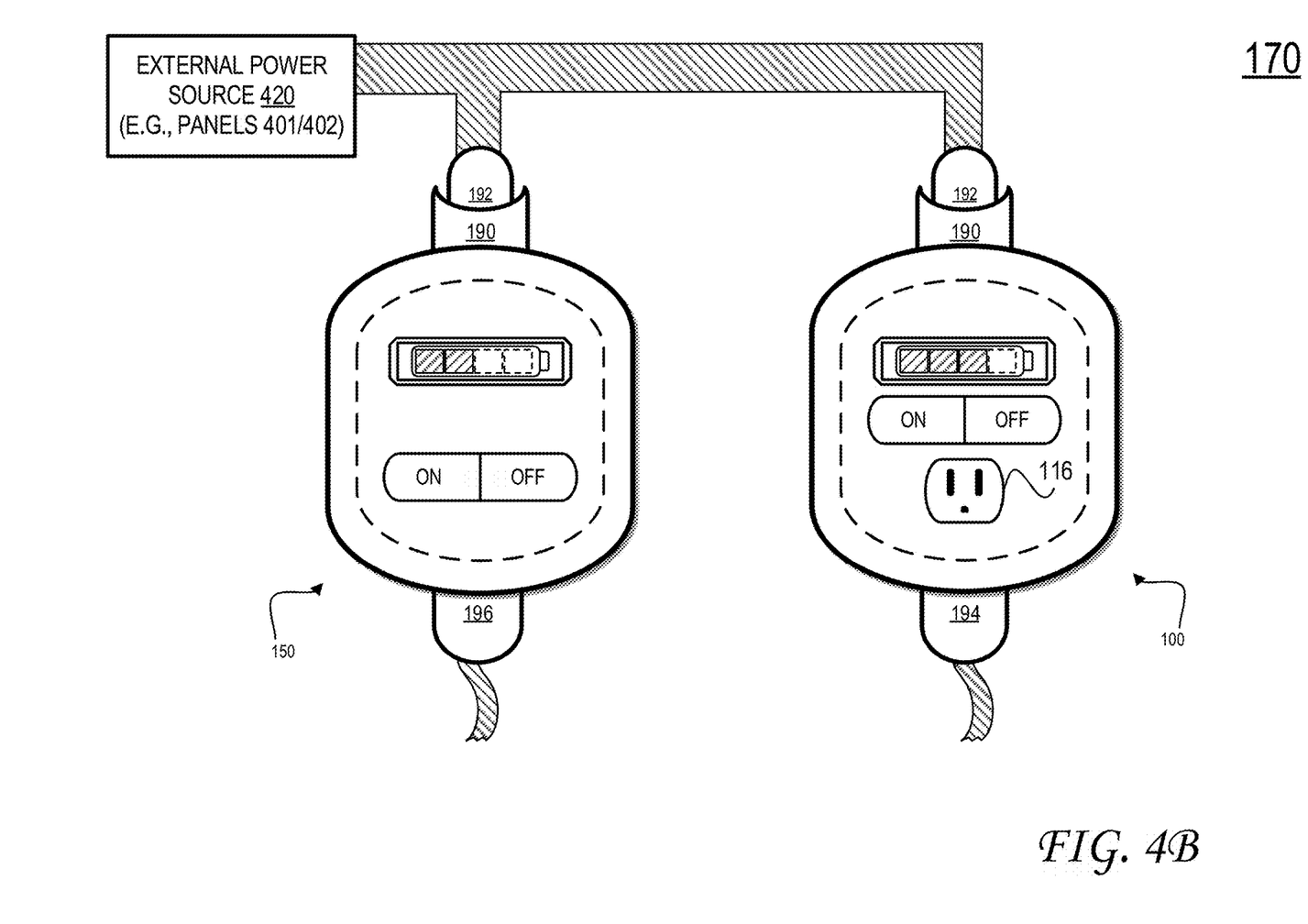
FIG. 4B illustrates a schematic block diagram of two power assembly modules being powered by an external power source and delivering power to devices.

FIG. 4B illustrates a schematic block diagram of power assembly module 150 of FIG. 1B and power assembly module 100 of FIG. 1A being powered by an external power source, and delivering power to client devices. External power source 420 may include any combination of: both photovoltaic panels 401 and 402 with their outputs connected in parallel (e.g., Panel 1 output and Panel 2 output of FIG. 4A connected in parallel), a single one of photovoltaic panels 401 and 402, an automobile battery, an electric car battery, or even another power assembly module (as shown in the example of FIG. 1C). External power source 420 has a power output that includes a connecting wire terminated in one or more charge supply terminals 192. As shown in FIG. 4B, each of the two charge supply terminals 192 of external power source 420 is connected to a respective power input 190 of power assembly module 100 and power assembly module 150.

In this way, power assembly module 100 and power assembly module 150 both receive input power from external power source 420 to charge their respective charge storage devices 220 (not pictured in FIG. 4B, but described above in connection with FIG. 2). Primary power output 196 outputs power from the charge storage device 220 of module 150 when its switch is activated in the "ON" position, to any device such as smartphone 422, wearable electronic device 424, or tablet 426. Secondary power output 194 similarly outputs power from the charge storage device 220 of module 100 when its switch is activated in the "ON" position, to any device such as smartphone 422, wearable electronic device 424, or tablet 426. Power distribution element 116 of module 100 outputs power from charge storage device 220 of module 100 when its switch is activated in the "ON" position, to any household appliance or device such as light bulbs 412, 414, and 416, or generally any home appliance that receives power through a male NEMA terminated plug can connect to power distribution element 116.

Figure 5A:
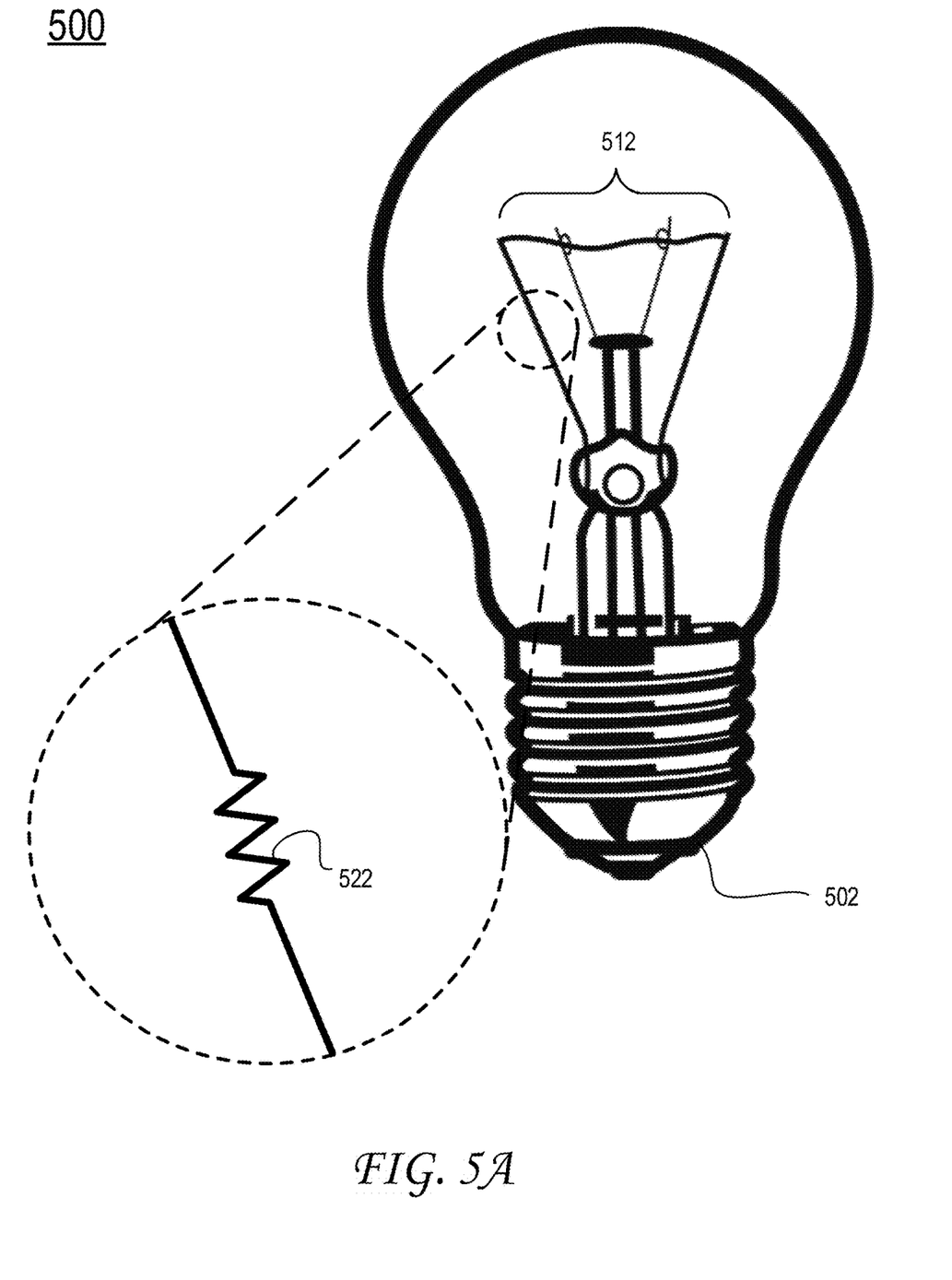
FIG. 5A illustrates a modified light emitting device with an inline resistive element that can be powered by the power assembly modules of FIGS. 1A and 1B.

FIG. 5A illustrates a modified light-emitting device 500 that can be powered by the power assembly module of FIG. 1. An exemplary light bulb 502 may represent one of the home appliances such as light bulbs 412, 414, and 416 of FIG. 4A. To produce light using the Vout1 DC voltage output by power distribution element 116, light bulb 502 may be modified. Specifically, light bulb 502 may be provided with an inline resistor 522, as a series resistance added to a light emitting element 512 of bulb 502. Inline resistor 522 can have a nominal resistance value of 1 Ohm.

Figure 5B:
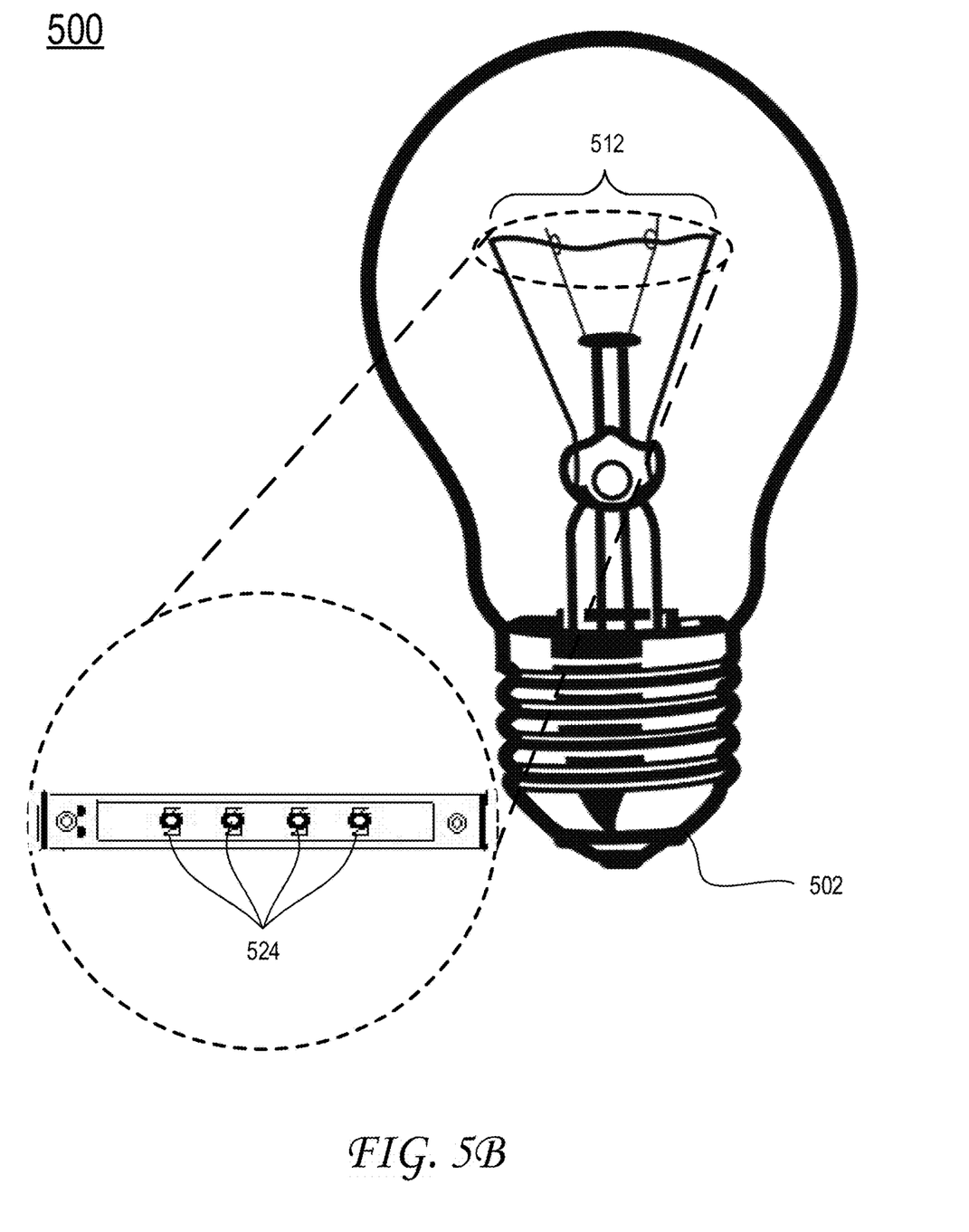
FIG. 5B illustrates the modified light emitting device of FIG. 5A, specifically highlighting the light emitting element that can be powered by the power assembly modules of FIGS. 1A and 1B.

FIG. 5B illustrates the modified light-emitting device 500 of FIG. 5A, specifically highlighting light-emitting element 512 of bulb 502. As shown in FIG. 5A, an inline resistor 522 can be connected in series with light-emitting element 512 to limit or specifically bias the current flowing through one of multiple light-emitting diodes 524 contained within element 512. Taken together, the light-emitting diodes 524 of element 512 may have an operating voltage between 3 and 4 Volts, may consume 1 to 3 Watts of power, may be rated for current between 350 to 700 milli-Amperes (mA), and may emit 110 to 280 lumens of light.

It should be understood from the foregoing that, while particular embodiments have been illustrated and described, various modifications can be made thereto without departing from the spirit and scope of the invention as will be apparent to those skilled in the art. Such changes and modifications are within the scope and teachings of this invention as defined in the claims appended hereto.

What is claimed is:
1. A power assembly, comprising:
 a module that receives and stores power for on-demand use, the module including:
  a housing;
  a circuit board positioned within the housing;
  a distribution element defined along the housing and electrically connected to the circuit board for distributing power to an electrical device;
  a battery management system including a battery positioned within the housing and electrically connected to the circuit board that provides the power to the distribution element;
  a power input for charging the battery using the battery management system, the power input configured to receive the power from a charge supply terminal that adapts DC input power to a DC voltage suitable for supplying the power to the battery; and a switch in electrical connection with the circuit board that controls transfer of the power from the battery to the distribution element.

2. The power assembly of claim 1, wherein the distribution element is an outlet for receiving a plug of the electrical device.

3. The power assembly of claim 1, wherein the distribution element includes a wired connector including a plurality of conductive wires for distributing the power from the battery to one or more electrical devices.

4. The power assembly of claim 1, further comprising:
a light element in electrical connection with the module, the light element including a resistor that adjusts a voltage provided to the light element from the module.

5. The power assembly of claim 1, wherein the module is adapted for mounting within a cavity of a building structure or electrical outlet receptacle box.

6. The power assembly of claim 1, wherein the module provides portable power to the electrical device.

7. The power assembly of claim 1, further comprising:
a power source; and
a wired connector including a plurality of conductive wires, the wired connector adapted to electrically couple the power source with the module such that the power source charges the battery.

8. The power assembly of claim 7, wherein the power source is a solar panel adapted for electrical connection with the module via a wired electrical connection.

9. The power assembly of claim 7, wherein the wired connector comprises a USB cable.

10. The power assembly of claim 7, wherein the power source is a vehicle battery.

11. The power assembly of claim 1, wherein the electrical device that receives power from the power distribution module is a light-emitting bulb.

12. The power assembly of claim 11, wherein the light-emitting bulb comprises a light-emitting element and a resistor connected in series.

13. The power assembly of claim 12, wherein the light-emitting element comprises one or more light-emitting diodes.

14. The power assembly of claim 1, wherein the module has a first power input, the power assembly further comprising:
a power source;
an additional module, wherein the additional module has a second power input and an additional battery; and
a wired connector that connects the power source to both the first power input and the second power input, such that the power source charges both the battery within the module and the additional battery within the additional module.

15. The power assembly of claim 14, wherein the module delivers power to a first device using the distribution element, and wherein the additional module delivers power to a second device using a separate output connector.

16. The power assembly of claim 1, wherein the distribution element distributes power to the electrical device at a first voltage level, and wherein the module further includes:
a boost converter coupled to the battery management system, that outputs power at a second voltage level that is higher than the first voltage level.

17. The power assembly of claim 1, wherein the module further includes:
a voltmeter coupled to an output of the battery management system, that produces a voltage measurement value.

18. The power assembly of claim 17, wherein the module further includes:
a display positioned in an opening of the housing, that is coupled to the voltmeter and that displays an illuminated battery graphic with an illumination level indicative of a charge level of the battery; and
a display driver that receives the voltage measurement value from the voltmeter and provides display signals to the display, the display signals corresponding to different illumination levels for the illuminated battery graphic based on the voltage measurement value.

19. A power assembly comprising:
a module that receives and stores power for on-demand use, the module including:
a housing;
a circuit board positioned within the housing;
a distribution element defined along the housing and electrically coupled to the circuit board for distributing power to an electrical device;
a battery management system including a battery positioned within the housing and electrically connected to the circuit board that provides power to the distribution element;
a switch in electrical connection with the circuit board that controls transfer of the power from the battery to the distribution element; and
an additional module adapted for electrical connection with the module such that the module is adapted to distribute the power stored within the battery to the additional module.

20. A portable power delivery module, comprising:
a housing;
a charge storage device positioned within the housing;
an input port that receives charging inputs for the charge storage device including DC power input;
circuitry electrically connecting the charge storage device to the input port, the circuitry further electrically connected with an output that provides power from the charge storage device at a first voltage level;
a switch that controls distribution of an output voltage associated with the power from the charge storage device by the output via the circuitry;
a primary power distribution element electrically connected to the switch that provides the power at the first voltage level; and
a secondary power distribution element electrically connected to the switch that provides the power at a second voltage level that is greater than the first voltage level.

* * * * *